United States Patent [19]

Fleischer et al.

[11] Patent Number: 4,806,853

[45] Date of Patent: Feb. 21, 1989

[54] HIGH ACCURACY FREQUENCY MODULATION WAVEFORM TESTER

[75] Inventors: Herman J. Fleischer, Plainview; John C. Bracken, Kings Park, both of N.Y.

[73] Assignee: Unisys Corporation, Blue Bell, Pa.

[21] Appl. No.: 148,244

[22] Filed: Jan. 25, 1988

[51] Int. Cl.$^4$ ............................................. G01R 23/14
[52] U.S. Cl. ................................... 324/79 R; 455/67; 455/226
[58] Field of Search .......................... 455/213, 226, 67; 324/77 R, 77 D, 77 E, 78 R, 78 D, 79 R, 79 D, 81, 82

[56] References Cited

U.S. PATENT DOCUMENTS 3,909,725 9/1975 Baghdady ........................... 455/213
4,088,948 5/1978 Miedema ............................... 455/67
4,653,116 3/1987 Lindenmeier ....................... 455/226

Primary Examiner—Michael J. Tokar
Attorney, Agent, or Firm—Albert B. Cooper

[57] ABSTRACT

The maximum and minimum depth of modulation of a carrier signal frequency modulated by a modulating sine wave is measured by a frequency counter responsive to an external gate. The external gate is generated by detecting the positive-going and negative-going zero crossings of the modulating signal and providing a gate generating trigger delayed by 90° of the modulating signal less a predetermined number of cycles of the carrier. The parameters are selected such that the gate is centered around the positive and negative peak amplitudes of the modulating signal.

6 Claims, 2 Drawing Sheets

HIGH ACCURACY FREQUENCY MODULATION WAVEFORM TESTER

BACKGROUND OF THE INVENTION

1. Field of the Invention

The invention relates to test equipment, particularly with respect to measuring depth of modulation of frequency modulated signals.

2. Description of the Prior Art

An a.c. carrier signal that is frequency modulated by, for example, a sinusoidal modulating signal is often provided by a waveform generator for utilization as a test signal or a stimulating signal in commercial and military environments. Such uses include commercial communication networks and military equipment such as sonar systems. It is often a requirement in such applications that the depth of modulation be measured to a high degree of accuracy such as 0.1% or better. Depth of modulation is the maximum positive and negative frequency deviation of the carrier signal as a result of the frequency modulation. In many commercial applications, the carrier frequencies utilized are in the radio, video and microwave ranges. In certain other applications, such as in sonar, the carrier or fundamental frequency may be in the audio range such as under 30 KHz. Precisely accurate measurements of the depth of modulation may be required, for example, for adjusting the carrier or the modulating signal of such waveform generators to compensate to anomolies such as drift.

Present day commercially available frequency modulation testers provide accuracies of only 2% to 3% of indicated readings. Additionally, testers are not available to obtain measurements on fm signals with fundamental frequencies below 100 KHz. Such present day fm testers are predicated on the principle of designing the best possible fm receiver with the best possible fm discriminators to provide the highest possible accuracy in the depth of modulation measurement. Such testers demodulate the incoming waveform to provide the depth of modulation. As discussed above, such testers do not achieve greater accuracy than 2% to 3% and cannot be utilized with carrier frequencies below 100 KHz. Additionally, such test instrumentation tends to be expensive since fm discriminators even with the limited accuracy available tend to be undesirably costly.

SUMMARY OF THE INVENTION

The disadvantages of the prior art are overcome by apparatus for measuring the depth of modulation of a signal frequency modulated by a modulating signal comprising a trigger generator responsive to the modulating signal for generating a gate signal in accordance with the maximum amplitude of the modulating signal. The gate signal is applied to a frequency measuring counter that measures the frequency of the frequency modulated signal in accordance with the gate signal. Preferably, the trigger generator generates the gate signal by detecting the occurrence of a predetermined phase angle of the modulating signal and delaying the generation of the gate signal so that the frequency measurements occur at the peak of the modulating signal.

By these means, a highly accurate measure of depth of modulation is obtained with respect to frequency modulated signals. The invention is usable with signals having low center frequencies of, for example, less than 100 KHz but is not limited thereto.

DESCRIPTION OF THE PREFERRED EMBODIMENT

Figure 1A:
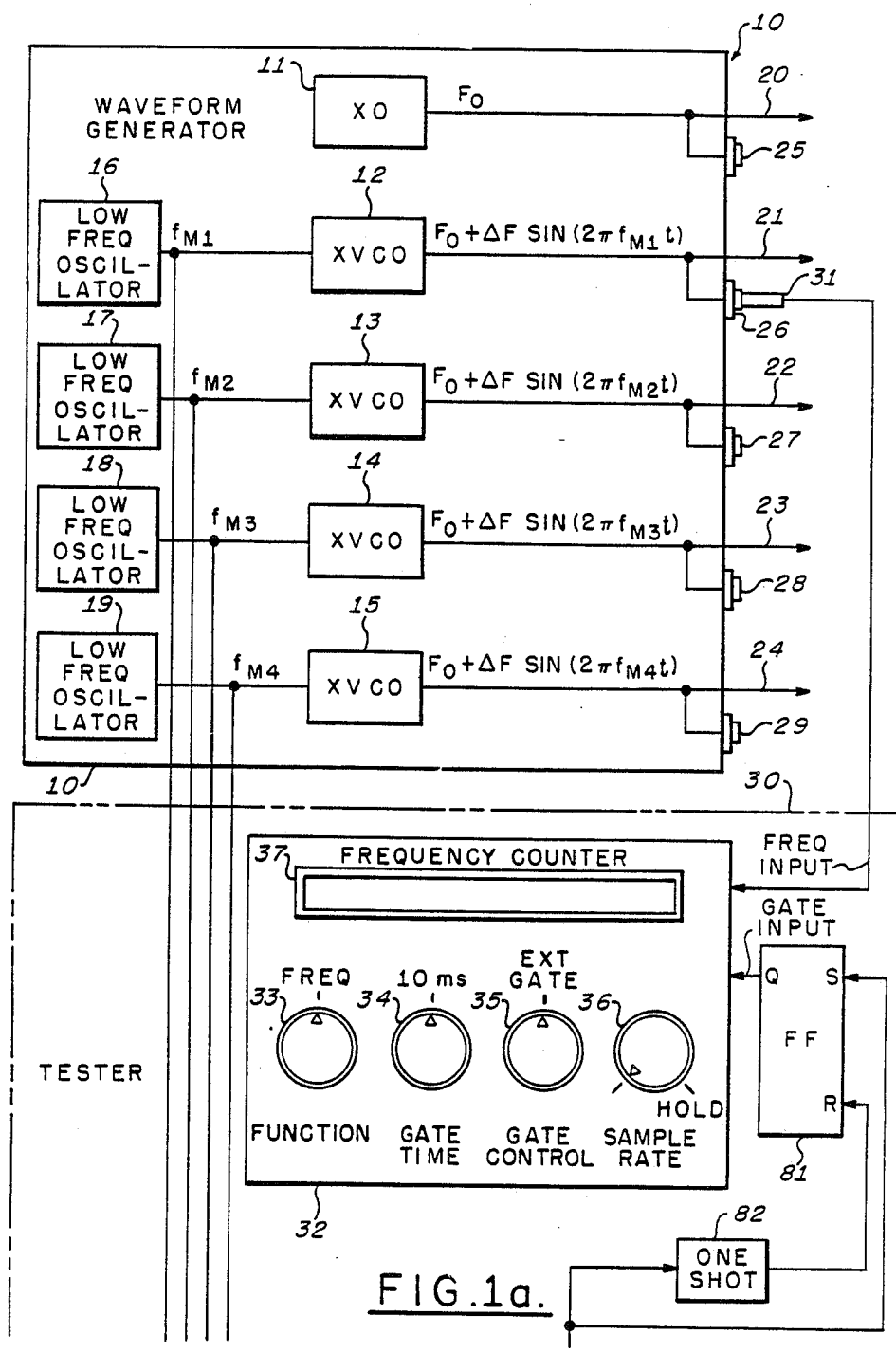
FIG. 1a and FIG. 1b are schematic block diagrams of a high accuracy frequency modulation waveform tester configured in accordance with the invention.
Figure 1B:
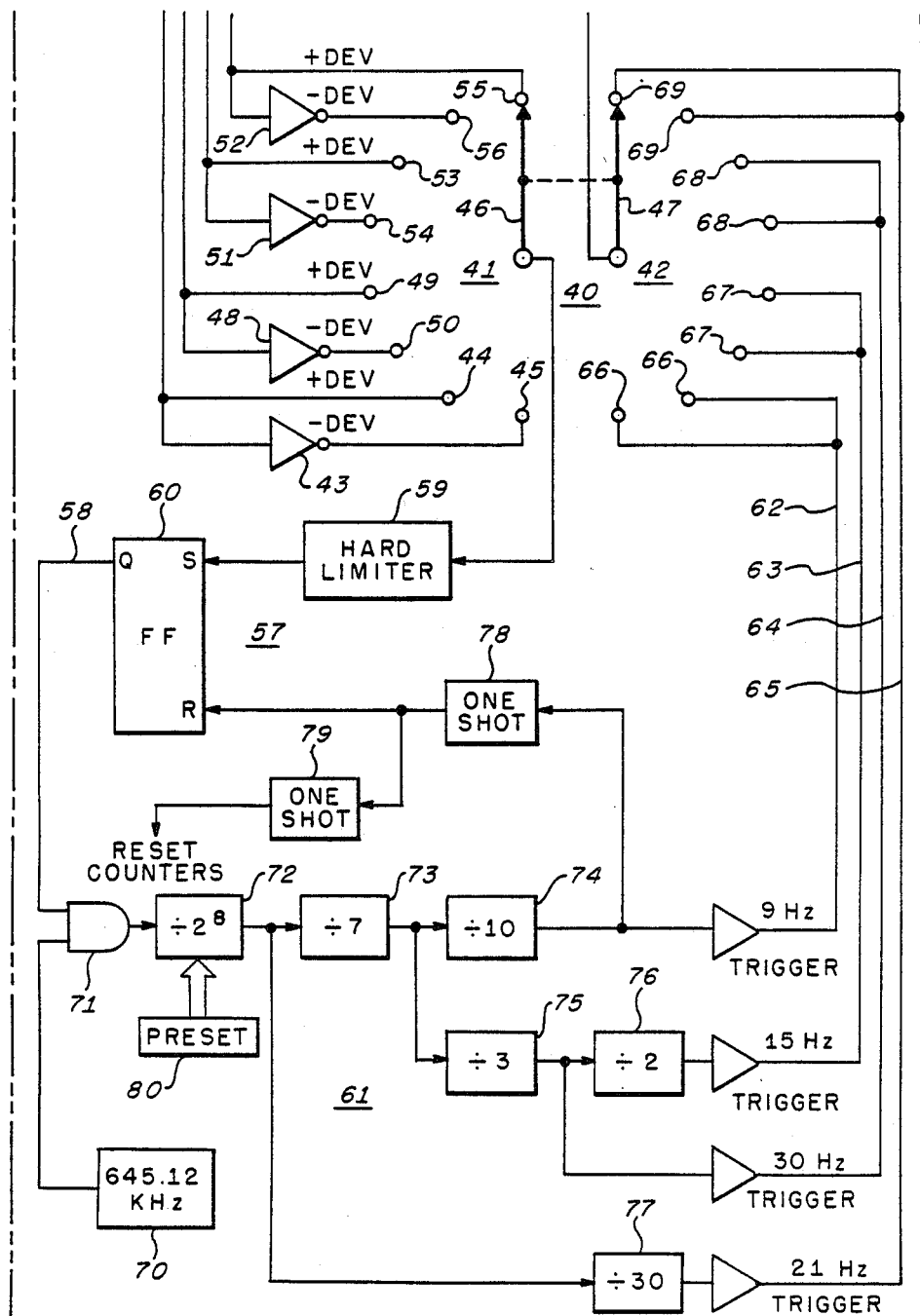

Referring to the sole figure, a waveform generator 10 includes a crystal oscillator 11 and four voltage controlled crystal oscillators 12-15. The crystal oscillator 11 provides a fixed frequency sinusoidal signal $F_O$ of, for example, 18 KHz. Each of the voltage controlled oscillators 12-15 provides a sinusoidal center frequency signal $F_O$, which is also, for example, 18 KHz. The frequency of the output signals from the voltage controlled crystal oscillators 12-15 are modulated by low frequency sinusoidal signals $f_{M1}$, $f_{M2}$, $f_{M3}$ and $f_{M4}$, from low frequency oscillators 16-19, respectively. The frequencies of the signals $f_{M1}$-$f_{M4}$ are, for example, 9 Hz, 15 Hz, 30 Hz and 21 Hz, respectively. The amplitudes of the low frequency modulating signals from the oscillators 16-19 are adjusted such that the depth of modulation of the signals from the oscillators 12-15 are ±90 Hz; ±150 Hz; ±300 Hz; and ±210 Hz. The outputs from the oscillators 11-15 are provided on lines 20-24, respectively, as stimulation signals to, for example, a sonar system for personnel training purposes. The signals on the lines 20-24 are applied to respective output jacks 25-29 for test purposes.

In order to measure the peak positive and negative fm deviation of each of the signals on the lines 21-24, a high accuracy fm tester 30 is included that provides accuracy of better than 0.1%. Thus, the tester 30 provides highly accurate measurements of frequency modulated signals with, for example, low fundamental frequencies such as under 100 KHz but is not limited thereto. A probe 31 is utilized to connect to the appropriate output jack 26-29 to apply the frequency modulated signal to be tested to the tester 30. The tester 30 also receives the low frequency modulation signals from the oscillators 16-19 and provide the depth of modulation readouts on a conventional frequency measuring counter 32 in a manner to be described. The counter 32 may, for example, comprise an HP5345A counter available from the Hewlett-Packard Company. Counters equivalent to the HP5345A may be utilized to the same effect.

The frequency counter 32 has a function control knob 33 that is set to measure frequency. The frequency modulated signal to be measured is provided by the probe 31 to the frequency input of the counter 32. The counter 32 includes a gate time control knob 34 that controls the nominal total gate time over which the frequency measurements are taken. In the present embodiment of the invention, the gate time knob 34 is set to 10 milliseconds. The counter 32 further includes a gate control knob 35 set to accept an external gate signal at the gate input to the counter. A sample rate knob 36 is included with the counter 32 and is positioned to its maximum setting for the purposes of the invention. The frequency readout is provided by a digital indicator 37.

Although it is recommended that the gate time knob 34 be set to 10 milliseconds, other settings may be utilized within the purview of the present invention. Utilizing the parameters of the preferred embodiment, however, the 10 millisecond setting provides a sufficient number of samples to reduce the trigger error of the counter 32, which is the largest system error, to a negligible amount. The external gate selected by the gate control knob 35 is applied at the gate input of the counter 32 in a manner to be explained.

Counters such as the frequency counter 32 measure the frequency of the signal applied to the frequency input thereof by detecting positive-going zero crossings of the signal and counting the pulses of an internal high frequency clock. The consecutively detected positive-going zero crossings control the counting operation so as to measure the frequency of the signal. The measurement operation begins at the first detected positive-going zero crossing after the rising edge of the gate input and continues until the positive-going zero crossing following the falling edge of the gate input. The count between each consecutive positive-going zero crossing provides a frequency measurement sample. When the gate time knob 34 is set to any position other than the minimum position thereof, the counter 32 accumulates as many external gate pulses as required to equal or exceed the gate time selected by the knob 34. The frequency measurements continue until the positive-going zero crossing following the falling edge of the last such accumulated external gate pulse. All of the frequency measurements taken pursuant to the external gate pulses so accumulated, are averaged by the frequency counter 32 to provide the frequency measurement readout on the indicator 37.

The tester 30 provides measurements of the maximum positive and maximum negative frequency deviations of each of the four modulated outputs on the lines 21–24. The measurement is effected by connecting the probe 31 to the output to be measured. In a manner to be described in detail, the tester 30 detects the positive and negative zero crossings of the low frequency modulating signals $f_{M1}$, $f_{M2}$, $f_{M3}$ and $f_{M4}$ and provides a sampling gate to the gate input of the counter 32 precisely delayed with respect to the zero crossing. The delay is such as to center the gate around the 90° point of the modulating signal to measure the positive depth of modulation and around the 270° point to measure the negative depth of modulation. The width of the gate is set so that the frequency counter 32 accepts ten samples of the modulated signal. Several such gates are accumulated by the counter 32 to provide an accurate measure of the peak deviations by averaging the samples of the frequency modulated signal. The total number of samples is controlled by the setting of the gate time control knob 34. The amount of delay introduced is dependent upon the specific modulating frequency. The positive or negative peak deviation measurement is obtained by switchably selecting either the positive or negative-going zero crossing of the low frequency modulating signal. The tester 30 therefore provides a resultant output frequency average of groups of ten samples of the modulated signal to be tested around the peak of the low frequency modulating signal. The low frequency sine wave over the gate time is sufficiently flat, i.e., close to plus and minus one, to provide the high accuracies for the maximum deviation measurements.

The tester 30 includes a two pole, eight position ganged rotary switch 40 having poles 41 and 42. The low frequency modulating signal $f_{M1}$ is connected directly and through an inverter 43 to contacts 44 and 45, respectively, of the pole 41. The pole 41 of the switch 40 includes a wiper 46 for connecting to the contacts of the pole 41. A wiper 47 ganged to the wiper 46 selectively connects to the contacts of the pole 42. When the wiper 46 is positioned to the contact 44, the tester 30 is set to measure the positive frequency deviation of the signal on the line 21. When the wiper 46 is positioned to the contact 45, the tester 30 is set to measure the negative frequency deviation of the signal on the line 21.

In a similar manner, the low frequency signal $f_{M2}$ is connected directly and through an inverter 48 to contacts 49 and 50, respectively, of the pole 41. When the wiper 46 is positioned to the contact 49, the tester 30 is set to measure the positive frequency deviation of the signal on the line 22. When the wiper 46 is positioned to the contact 50, the negative deviation of the signal on the line 22 is measured. In a like manner, the low frequency signals $f_{M3}$ and $f_{M4}$ are connected directly and through inverters 51 and 52 to contacts 53–56 of the pole 41. When the wiper 46 is positioned to the contacts 53 and 54, the positive and negative deviations, respectively, of the signal on the line 23 are measured. Similarly, when the wiper 46 is positioned to the contacts 55 and 56, the positive and negative deviations, respectively, of the signal on the line 24 is measured.

The wiper 46 of the pole 41 is connected to a Schmitt trigger 57 that provides a sharply rising positive-going edge on a line 58 in response to positive-going zero crossings at the contacts of the pole 41 of the switch 40. It is appreciated that such positive-going zero crossings at the contacts 44, 49, 53 and 55 occur at the positive-going zero crossings of the low frequency modulating signals. The positive-going zero crossings at the contacts 45, 50, 54 and 56, however, occur at the negative-going zero crossings of the low frequency signals because of the inverters 43, 48, 51 and 52. The Schmitt trigger 57 is implemented by a hard limiter 59 that amplifies and clips the low frequency signals and a flip-flop 60 that is set by the positive-going zero crossings from the hard limiter 59. The Q output of the flip-flop 60 provides the sharply rising edge on the line 58.

The selected positive-going or negative-going zero crossing of the low frequency signal from the oscillators 16–19, via the Schmitt trigger 57, triggers a digital delay 61. The digital delay 61 provides a 9 Hz trigger, a 15 Hz trigger, a 30 Hz trigger, and a 21 Hz trigger on lines 62–65, respectively. Each of the triggers on the lines 62–65 occurs after a time delay from the zero crossing of the associated low frequency signal that is equal to 90° of the associated low frequency signal less five cycles of the carrier $F_O$. Thus, when the wiper 46 is positioned to the contact 44, the 9 Hz trigger on the line 62 occurs at the 90° point of the $f_{M1}$ signal (less five cycles of $F_O$) for measuring the positive depth of modulation of the signal on the line 21. When the wiper 46 is positioned to the contact 45, the 9 Hz trigger on the line 62 occurs at the 270° point of $f_{M1}$ (less five cycles of $F_O$) for measuring the negative depth of modulation of the signal on the line 21. In a similar manner, the 15 Hz trigger, the 30 Hz and the 21 Hz trigger on the lines 63–65, respectively, are utilized to measure the positive and negative peak frequency deviations of the signals on the lines 22–24, respectively. The 9 Hz trigger on the line 62 is applied to contacts 66 of the pole 42 of the switch 40. In a similar manner, the triggers on the lines 63–65 are applied to contacts 67–69 of the pole 42, respectively. Thus, it is appreciated that the wiper 47 is positioned to receive the 9 Hz trigger when the wiper 46 is positioned to measure both the positive and negative deviations of the signal on the line 21. In a similar manner, the wiper 47 is positioned to receive the appropriate trigger for the positive and negative deviation measurements for each of the signals to be tested on the lines 22–24.

The digital delay 61 is implemented by a sequence of digital counters driven by a 645.12 KHz clock 70 controlled by the flip-flop 60. Accordingly, the signal from the clock 70 is applied as an input to an AND gate 71 that receives a start/stop control signal on the line 58. The 9 Hz trigger is generated by cascaded digital counters 72–74 that divide by $2^8$, 7 and 10, respectively. The 15 Hz trigger is generated by the cascaded counters 72, 73 and further cascaded counters 75 and 76 that divided by 3 and 2, respectively. The 30 Hz trigger is provided by the counter 75 and the 21 Hz trigger is provided from a counter 77 that divides by 30 cascaded with the counter 72. The output of the counter 74 is utilized to reset the flip-flop 60 via a one shot 78. The output of the one shot 78 is utilized to reset the counters 72–77 via a one shot 79.

It is appreciated that if the counters 72–77 are reset to zero and counting is initiated by a zero crossing of one of the low frequency signals $f_{M1}$–$f_{M4}$, the 9 Hz, 15 Hz, 30 Hz and 21 Hz triggers will occur precisely at the positive and negative peaks of the low frequency signals. It is desirable, however, for the triggers to occur five cycles of $F_O$ earlier than the peak deviation so that ten samples of the modulated signal under test may be taken centered around the peak. In order to remove such an amount of delay, certain stages of the counter 72 are preset by a presetting means 80 after all of the counters have been reset to zero. The counter 72 comprises an eight stage counter, where bit 1 is the least significant bit and bit 8 is the most significant bit. The preset 80 presets bits 1, 2, 5, 6 and 8 to one in order to remove the appropriate amount of delay. The counter 72 is preset by the presetting means 80 once per sampling gate generation.

The wiper 47 is connected to set a gate generating flip-flop 81 and to reset the flip-flop 81 via a one shot 82. The Q output of the flip-flop 81 provides the external gate to the gate input of the frequency counter 32. The one shot 82 defines the width of the external sampling gate. The gate width is selected to encompass ten cycles of $F_O$. In the present embodiment, a gate width of $0.56 \pm 0.05$ milliseconds is utilized.

Thus, in order to measure the positive depth of modulation of the signal on the line 21, the probe 31 is connected to the output jack 26 and the switch 40 is operated so that the wiper 46 is positioned to the contact 44 and the ganged wiper 47 is positioned to the associated contact 66. The positive-going zero crossing of $f_{M1}$ generates a trigger on the line 62 which produces an external sampling gate at the gate input of the counter 32. During each sampling gate ten frequency samples are taken. As previously described, the number of consecutive sampling gates utilized for a frequency measurement is determined by the setting of the gate time knob 34. In a similar manner, the negative deviation of the signal on the line 21 is measured by positioning the wiper 46 to the contact 45 with the ganged wiper 47 positioned to the associated contact 66.

The positive and negative depth of modulation of the signal on the line 22 are measured by connecting the probe 31 to the jack 27 and positioning the wiper 46 to the contacts 49 and 50, respectively, with the wiper 47 positioned to the corresponding contacts 67. In a similar manner, the positive and negative deviations of the signal on the line 23 are measured by connecting the probe 31 to the jack 28 and positioning the wiper 46 to the contacts 53 and 54, respectively, with the ganged wiper 47 positioned to the corresponding contacts 68. Similarly, the positive and negative depth of modulation of the signal on the line 24 are measured by connecting the probe 31 to the jack 29 and positioning the wiper 46 to the contacts 55 and 56, respectively, with the ganged wiper 47 positioned to the corresponding contacts 69. Thus, it is appreciated that the tester 30 provides an external gate to the counter 32 centered at the positive and negative peaks of the low frequency signals to sample five cycles prior to the peak and five cycles subsequent to the peak of the modulated signal under test. The leading edge of the sampling gate generated by the flip-flop 81 is determined by the appropriate trigger and the trailing edge is determined by the one shot 82.

The preferred embodiment of the invention was described in terms of detecting the positive-going and negative-going zero crossings of the low frequency modulated signal and delaying the sampling gate by one-quarter of a cycle of the low frequency signal. Alternatively, the invention may be embodied by detecting only the positive-going zero crossings and delaying the sampling gate by one-quarter of a cycle for measuring the positive deviations and by three-quarters of a cycle for measuring the negative deviations. The invention may also be practiced by utilizing a manually variable delay and adjusting the delay until maximum and minimum frequency measurements are obtained by the counter 32 in measuring the positive and negative depth of modulation. In such an embodiment the sampling gate is manually positioned to the peak deviation.

Thus, the present invention provides a tester for measuring the maximum and minimum depth of modulation of a frequency modulated signal with an accuracy of 0.1%. The invention is usable, inter alia, with audio signals of less than 100 KHz.

The embodiment of the invention described herein was explained in terms of providing inversions of the low frequency signals, via the inverters 43, 48, 51 and 52 prior to effecting hard limiting by the hard limiter 59. The invention may also be embodied by effecting the inversion after the hard limiting. In such an embodiment, the inverters 43, 48, 51 and 52 would not be utilized as illustrated but instead the contacts 45, 50, 54 and 56 would be connected directly to the outputs of the oscillators 16–19, respectively. The output of the hard limiter 59 would be provided directly and through an inverter to a third ganged pole of the switch 40. The inverter output of the hard limiter 59 would be applied to the contacts of the third pole corresponding to the negative deviation contacts of the pole 41. The direct output of the hard limiter 59 would be connected to the contacts of the third pole corresponding to the positive deviation contacts of the pole 41. The wiper of the third pole would be connected to the set input of the flip-flop 60. This embodiment would tend to be more accurate than the embodiment described above since inverting hard limited digital signals as compared to inverting analog signals results in less phase error.

While the invention has been described in its preferred embodiment, it is to be understood that the words have been used are words of description rather than limitation and that changes may be made within the purview of the appended claims without departing from the true scope and spirit of the invention in its broader aspects.

We claim:

1. Apparatus for measuring the depth of modulation of a carrier signal, said carrier signal being frequency modulated by a modulating signal, said modulating signal having a maximum amplitude, said depth of modulation being the maximum frequency deviation of said carrier signal as a result of said frequency modulation, comprising trigger generator means responsive to said modulating signal for generating a gate signal in accordance with said maximum amplitude of said modulating signal, said gate signal having a duration, and frequency measuring counter means responsive to said frequency modulated carrier signal and said gate signal for measuring the frequency of said frequency modulated carrier signal during said duration of said gate signal.

2. The apparatus of claim 1 wherein said trigger generator means comprises phase angle detecting means responsive to said modulating signal for detecting the occurrence of a predetermined phase angle thereof, and delay means for generating said gate signal in accordance with a predetermined delay after the occurrence of said predetermined phase angle.

3. The apparatus of claim 2 wherein
   said modulating signal comprises a sinusoidal signal, said phase angle detecting means comprises zero crossing detecting means for detecting the zero crossings of said modulating signal, and said delay lines comprises means for delaying generation of said gate signal for a time interval in accordance with 90° of said modulating signal.

4. The apparatus of claim 3 wherein
   said zero crossing detecting means comprises means for detecting positive-going and negative-going zero crossings of said modulating signal, and said delay means comprises means for delaying generation of said gate signal by a time interval equal to 90° of said modulating signal less a predetermined number of cycles of said frequency modulated carrier signal so that said gate signal is centered at the positive and negative peak amplitudes of said modulating signal.

5. The apparatus of claim 4 wherein said delay means comprises binary counter means and said delay means further includes presetting means for presetting said binary counter means so that a time interval equal to said predetermined number of cycles of said frequency modulated signal is removed from said predetermined delay.

6. The apparatus of claim 4 wherein said duration of said gate signal comprises a time interval equal to twice said predetermined number of cycles of said frequency modulated carrier signal.

* * * * *